(12) United States Patent
Cheng et al.

(10) Patent No.: US 10,670,970 B1
(45) Date of Patent: Jun. 2, 2020

(54) LITHOGRAPHY SYSTEM AND METHOD THEREOF

(71) Applicant: TAIWAN SEMICONDUCTOR MANUFACTURING CO., LTD., Hsinchu (TW)

(72) Inventors: Wei-Shin Cheng, Hsinchu (TW); Hsin-Feng Chen, Yilan (TW); Cheng-Hao Lai, Taichung (TW); Shao-Hua Wang, Taoyuan (TW); Han-Lung Chang, Kaohsiung (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/257,232

(22) Filed: Jan. 25, 2019

(51) Int. Cl.
| G03F 1/58 | (2012.01) |
| G03F 7/24 | (2006.01) |
| G03F 7/00 | (2006.01) |
| G03F 1/52 | (2012.01) |
| G03F 7/20 | (2006.01) |
| G03F 1/24 | (2012.01) |

(52) U.S. Cl.
CPC ............ *G03F 7/70033* (2013.01); *G03F 1/24* (2013.01); *G03F 1/52* (2013.01); *G03F 1/58* (2013.01); *G03F 7/70058* (2013.01); *G03F 7/70625* (2013.01); *G03F 7/70641* (2013.01)

(58) Field of Classification Search
CPC .......... G03F 7/70033; G03F 1/24; G03F 1/52; G03F 1/58; G03F 7/70058; G03F 7/70625; G03F 7/70641
USPC ................................ 250/493.1, 494.1, 504 R
See application file for complete search history.

(56) References Cited

U.S. PATENT DOCUMENTS

| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 4/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2005/0213071 A1* | 9/2005 | Fukuda ................... G03B 21/13 355/69 |
| 2006/0209631 A1* | 9/2006 | Melese ..................... A61B 5/11 367/7 |

(Continued)

*Primary Examiner* — Nicole M Ippolito
(74) *Attorney, Agent, or Firm* — McClure, Qualey & Rodack, LLP

(57) ABSTRACT

A method includes providing a plurality of fuel droplets into an EUV source vessel by a fuel droplet generator, in which the fuel droplet generator has a first portion inside the EUV source vessel and a second portion outside the EUV source vessel; generating a plurality of output signals respectively from a plurality of oscillation sensors on the fuel droplet generator; determining whether the output signals are acceptable; and determining whether an unwanted oscillation originates from the first portion of the fuel droplet generator or the second portion of the fuel droplet generator when the output signals is determined as unacceptable.

20 Claims, 7 Drawing Sheets

(56) References Cited

U.S. PATENT DOCUMENTS

| | | | | |
|---|---|---|---|---|
| 2008/0285602 A1* | 11/2008 | Nagai | ................... | H01S 3/134 |
| | | | | 372/20 |
| 2013/0075625 A1* | 3/2013 | Yabu | ..................... | H05G 2/005 |
| | | | | 250/428 |
| 2018/0191958 A1* | 7/2018 | Kusunose | ........... | G03F 7/70008 |
| 2018/0375283 A1* | 12/2018 | Kurosawa | ............... | H01S 3/104 |
| 2019/0045616 A1* | 2/2019 | Takashima | ................ | H01S 3/09 |

* cited by examiner

LITHOGRAPHY SYSTEM AND METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4x reduction projection printing, similar to some optical scanners, except that the EUV scanners use reflective rather than refractive optics, i.e., mirrors instead of lenses. EUV scanners provide desired patterns on wafers by transferring mask patterns defined by an absorber layer. Currently, binary intensity masks (BIM) accompanied by on-axis illumination (ONI) are employed in EUVL. In order to achieve adequate aerial image contrast for future nodes, e.g., nodes with the minimum pitch of 32 nm and 22 nm, etc., several techniques, e.g., the attenuated phase-shifting mask (AttPSM) and the alternating phase-shifting mask (AltPSM), have been developed to obtain resolution enhancement for EUVL. But each technique has its limitation needed to be overcome. For example, an absorption layer however may not fully absorb the incident light and a portion of the incident light is reflected from the absorption layer. Also the thickness of the absorption layer causes the shadowing effect. All of these often result in reduced aerial image contrast, which may lead to poor pattern profiles and poor resolution, particularly as pattern features continue to decrease in size. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
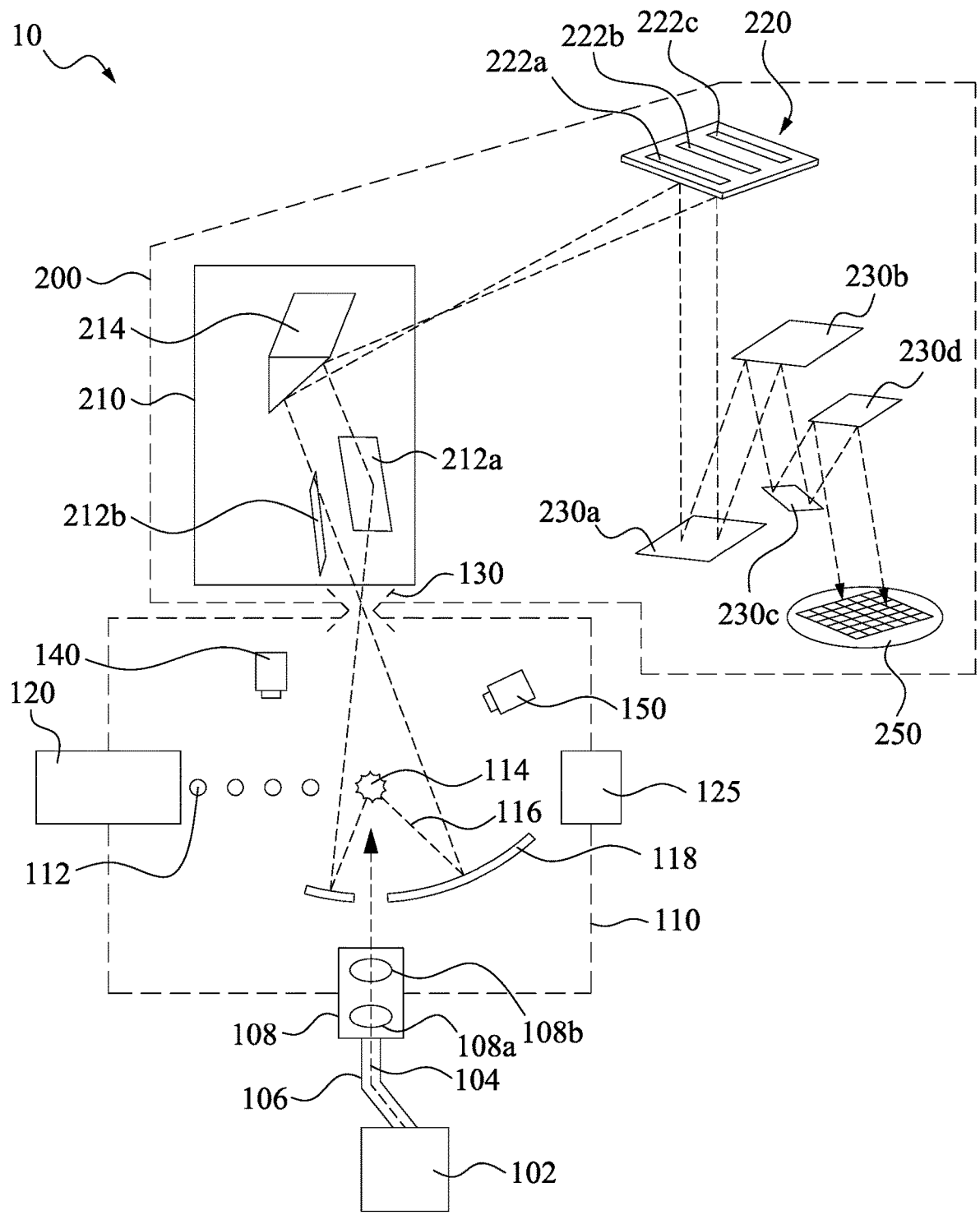
FIG. 1 is a schematic view of lithography system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic view of lithography system in accordance with some embodiments of the present disclosure. Shown there is a EUV lithography system 10. Although the EUV lithography system 10 is illustrated as having a certain configuration of components, it will be appreciated that the disclosed lithography system 10 may include additional components (e.g., additional mirrors) or having less components (e.g., less mirrors).

The EUV lithography system 10 includes a EUV source vessel 110. A fuel droplet generator 120 is connected to the EUV source vessel 110 and is configured to generate a plurality of fuel droplets 112. In some embodiments, the fuel droplets 112 generated by the fuel droplet generator 120 are provided into the EUV source vessel 110. In some embodiments, the fuel droplets 112 may include tin (Sn). In other embodiments, the fuel droplets 112 may include a different metal material. In some embodiments, the EUV source vessel 110 can also be referred to as a radiation source, in which radiation source employs a laser produced plasma (LPP) mechanism to generate plasma and further generate EUV light from the plasma.

The EUV lithography system 10 may also include a droplet position detection system which may include a droplet imager 140 disposed in the EUV source vessel 110 that captures an image of one or more fuel droplets 112. The droplet imager 140 may provide this captured image to a droplet position detection feedback system (not shown), which can, e.g., generate a droplet position and trajectory in response the an analysis result of the captured image. The position detection feedback system can thus generate a droplet error in response to the generated droplet position and trajectory, e.g., based on a droplet-by-droplet basis, or on average. In some embodiments, the droplet imager 140 may include a fine droplet steering camera (FDSC), a droplet formation camera (DFC), and/or suitable devices.

The EUV lithography system 10 further includes a primary laser having a laser source 102 configured to produce a laser beam 104. In some embodiments, the laser source 102 may include a multi-stage laser having a plurality of stages configured to amplify laser light produced by a prior stage. The laser beam 104 passes through a beam transport system 106 configured to provide the laser beam to a focusing system 108. The focusing system 108 includes one or more lenses 108a, 108b and/or mirrors arranged within a beam line and configured to focus the laser beam 104. The laser beam 104 is output from the focusing system 108 to the EUV source vessel 110.

The laser beam 104 transmits through a collector mirror 118 located within the EUV source vessel 110. Then, the primary laser beam 104 generated by the laser source 102 intersects the fuel droplets 112. In some embodiments, the primary laser beam 104 may be a carbon dioxide ($CO_2$) laser. In other embodiments, the primary laser beam 104 may include alternative types of lasers. When the primary laser beam 104 strikes the fuel droplets 112, the primary laser beam 104 heats the fuel droplets 112 to a critical temperature. At the critical temperature, the fuel droplets 112 shed their electrons and become a plasma 114 including a plurality of ions. In some embodiments, the ions emit EUV radiation 116 (e.g., having a wavelength of approximately 13.3 nm to about 13.7 nm).

In some embodiments, the collector mirror 118 has a concave curvature. In some embodiments, the collector mirror 118 may include a multi-layer coating having alternating layers of different materials. For example, in some embodiments, the collector mirror 218 may include alternating layers of molybdenum and silicon configured to operate as a Bragg reflector. The concave curvature of the collector mirror 218 focuses the EUV radiation 116 generated by the plasma 114 toward an intermediate focus (IF) unit 130 within an exit aperture of the EUV source vessel 110. The intermediate focus unit 130 is located between the EUV source vessel 110 and a scanner 200 including optical elements configured to direct the EUV radiation 116 to a workpiece (e.g., a semiconductor substrate). In some embodiments, the intermediate focus unit 130 may include a cone shaped aperture configured to provide for separation of pressures between the EUV source vessel 110 and the scanner 200. In some embodiments, the intermediate focus unit 130 may extend into the scanner 200.

The EUV lithography system 10 may also include an EUV energy monitor 150 disposed in the EUV source vessel 110. The EUV energy monitor 150 is designed to monitor the EUV intensity or energy generated from the EUV source vessel 110. For example, the EUV energy monitor 150 includes an EUV sensing element, such as a diode, designed to be sensitive to the EUV light and configured to effectively detect the EUV light. In other examples, the EUV energy monitor 150 includes a plurality of diodes configured in an array to effectively detect the EUV light for monitoring purpose. In some embodiments, a dose error is calculated based on the sensed EUV intensity (or energy). For example, when the sensed EUV intensity (or energy) is below a predetermined threshold value, such situation can be referred to as a dose error. Generally, the dose error is related to the plasma instability, through monitoring the EUV intensity by the EUV energy monitor 150, the dose error can be extracted from the monitored EUV intensity. Therefore, when a dose error is occurred, it indicates that the plasma 114 is unstable.

In some embodiments, the EUV lithography system further includes a droplet collection element 125 disposed in the EUV source vessel 110 and located opposite to the droplet generator 120. The droplet collection element 125 is configured to collect fuel droplets 112 that are not vaporized during formation of the EUV radiation 116 and/or fragments of fuel droplets 112 generated during formation of the EUV radiation 116.

The EUV radiation 116 output from the EUV source vessel 110 is provided to a condenser 210 by way of the intermediate focus unit 130. In some embodiments, the condenser 210 includes first and second surfaces 212a and 212b configured to focus the EUV radiation 116, and a reflector 214 configured to reflect the EUV radiation 116 towards an EUV photomask 220. The EUV photomask 220 is configured to reflect the EUV radiation 116 to form a pattern on a surface of a semiconductor workpiece 250. To produce the pattern, the EUV photomask 220 may include a plurality of absorptive features 222a, 222b, and 222c arranged on a front surface of the EUV photomask 220. The plurality of absorptive features 222a, 222b, and 222c are configured to absorb the EUV radiation 116, such that the reflected rays of EUV radiation 116 conveys a patterned defined by the EUV photomask 220.

The EUV radiation 116 is filtered through reduction optics including a series of first to fourth mirrors 230a, 230b, 230c, and 230d, which serve as lenses to reduce a size of the pattern carried by the EUV radiation 116. In some embodiments, the fourth mirror 230d conveys the EUV radiation 116 onto a on a layer of photoresist disposed on a surface of the semiconductor workpiece 250. The EUV radiation 116 irradiates particular regions of the layer of photoresist based on the pattern carried by the EUV radiation 116, and thus the layer of irradiated photoresist layer can be patterned after developing it. Therefore, subsequent processing can be performed on selected regions of the semiconductor workpiece 250.

Figure 2:
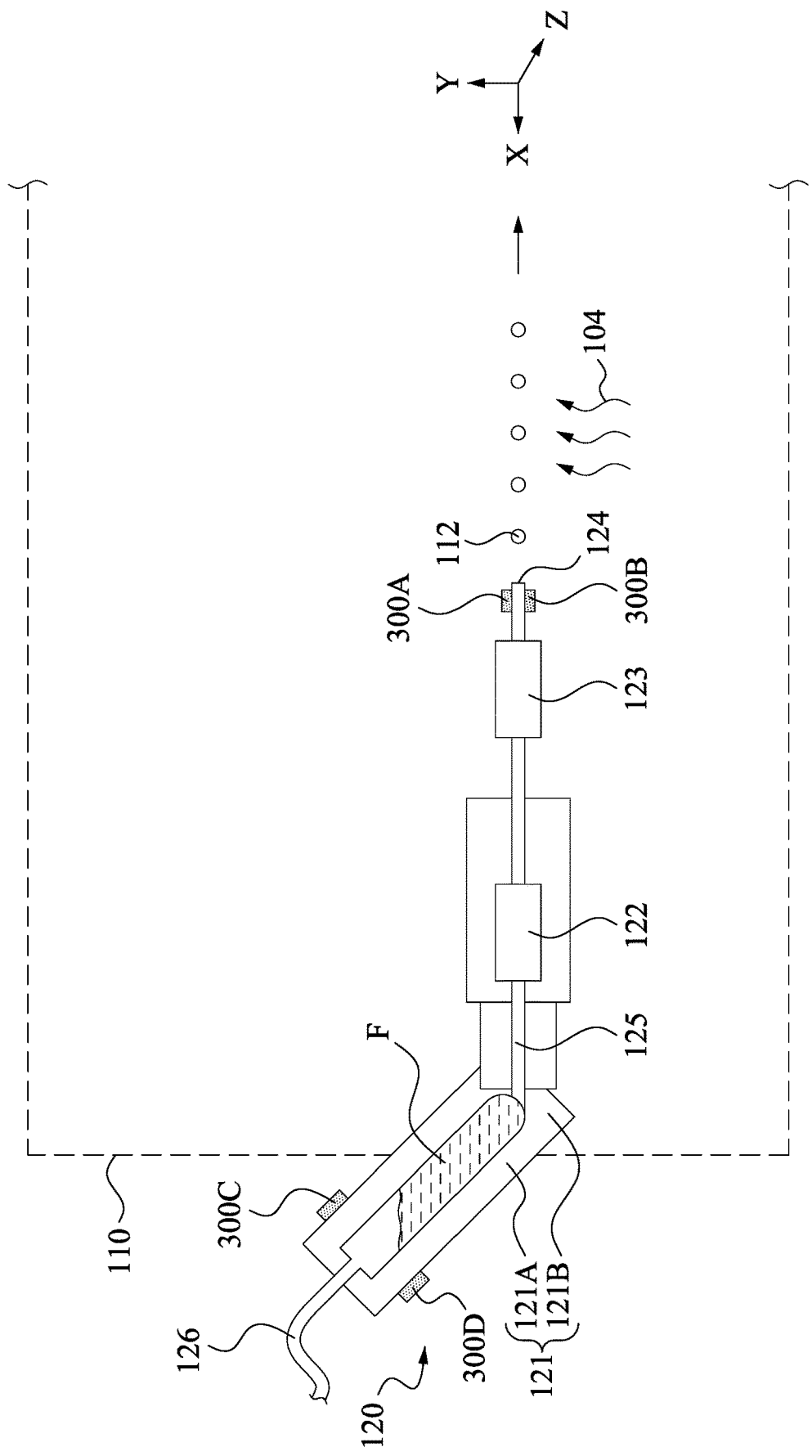
FIG. 2 is a schematic view of a droplet generator in accordance with some embodiments of the present disclosure.

Reference is made to FIG. 2. FIG. 2 illustrates a detail structure of fuel droplet generator 120 of FIG. 1. In some embodiments, the fuel droplet generator 120 includes a reservoir 121, a filter 122, an electro-actuatable element 123, a nozzle 124, a tube 125, and a gas supply pipe 126. The reservoir 121 has a first portion 1201A and a second portion 1201B connected to each other, in which the first portion 1201A is disposed outside the EUV source vessel 110, and the second portion 1201B is disposed inside the EUV source vessel 110. In some embodiments, the EUV source vessel 110 includes a processing chamber held under vacuum (e.g., at a pressure of less than $10^{-2}$ mbar). That is, the gas environment inside the EUV source vessel 110 has a lower atmosphere pressure than the gas environment outside the EUV source vessel 110. Accordingly, the second portion 1201B of the reservoir 121 is disposed in a vacuum environment, and the first portion 1201A of the reservoir 121 is disposed in a non-vacuum environment. Further, the filter 122, the electro-actuatable element 123, the nozzle 124, and the tube 125 are disposed in the vacuum environment of the EUV source vessel 110. Stated another way, a part of the fuel droplet generator 120 is disposed in a vacuum environment, and another part of the fuel droplet generator 120 is disposed in a non-vacuum environment.

The reservoir 121 is configured for holding a fuel F. In some embodiments, the fuel F may include tin. In some other embodiments, other material may also be used for the fuel F, for example, a tin-containing liquid material such as eutectic alloy containing tin, lithium (Li), and xenon (Xe). In some embodiments, the reservoir 121 may include a heating element (not shown) to controllably maintain the reservoir 121 or selected sections thereof at a temperature above the melting temperature of the fuel F. Further, the gas supply pipe 126 is in gaseous communication with the reservoir 121. In some embodiments, an inert gas, such as argon (Ar), may be introduced into the reservoir 121 through the gas supply pipe 126, such that the molten fuel F may be placed under a pressure. The tube 125 is in fluidly communication with the bottom of the reservoir 121, and the pressure of the gas forces the molten fuel F into the tube 125 from the bottom of the reservoir 121 and pass through the tube 125 until the molten fuel F is ejected out of the nozzle 124.

The filter 122 is arranged between the reservoir 1202 and the electro-actuatable element 123. The filter 122 to is configured to prevent the nozzle 124 from being clogged with contamination, thus resulting in a change of effective geometry of the nozzle 124. In some embodiments, the filter 122 is configured to prevent contamination with an average diameter smaller than the nozzle diameter (i.e., the opening of the nozzle 124) from reaching the nozzle 124. The nozzle 124 is disposed at the end of the tube 125, from which the fuel F is ejected along a trajectory. For example, the trajectory is coaxial with an axis which runs along the center of the tube 125. In FIG. 2, the ejecting trajectory is coaxial with –X direction. In some embodiments, the fuel F ejected out of the nozzle 124 can be referred to as fuel droplets 112.

The electro-actuatable element 123 may be coupled to the tube 125. For example, an electro-actuatable element may be coupled to the tube 125 to deflect the tube 125 and disturb the stream (e.g., the fuel F) flowing in the tube 125. For example, the disturbance may be applied to the stream by coupling the electro-actuatable element 123 (such as a piezoelectric material) to the stream and driving the electro-actuatable element with a periodic waveform. As used herein, the term "electro-actuatable element" and its derivatives, means a material or structure which undergoes a dimensional change when subjected to a voltage, electric field, magnetic field, or combinations thereof and includes, but is not limited to, piezoelectric materials, electrostrictive materials and magnetostrictive materials.

As mentioned above, the fuel F is forced into the tube 125 from the reservoir 121 via a pressure, when the fuel F flows to the nozzle 124, the fuel F subsequently breaks-up into several fuel droplets 112. In some embodiments, the electro-actuatable element 123, e.g., having a ring-shape or cylindrical tube shape, may be positioned to surround a circumference of the tube 125. When driven, the electro-actuatable element 123 may selectively squeeze and/or un-squeeze the tube 125 to disturb the stream in the tube 125. It is to be appreciated that two or more electro-actuatable elements may be employed to selectively squeeze the tube 125 at respective frequencies.

Figure 3A:
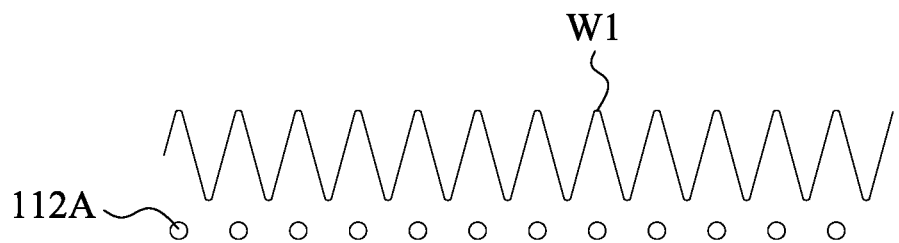
FIGS. 3A to 3C are patterns of droplets in accordance with some embodiments of the present disclosure.
Figure 3B:
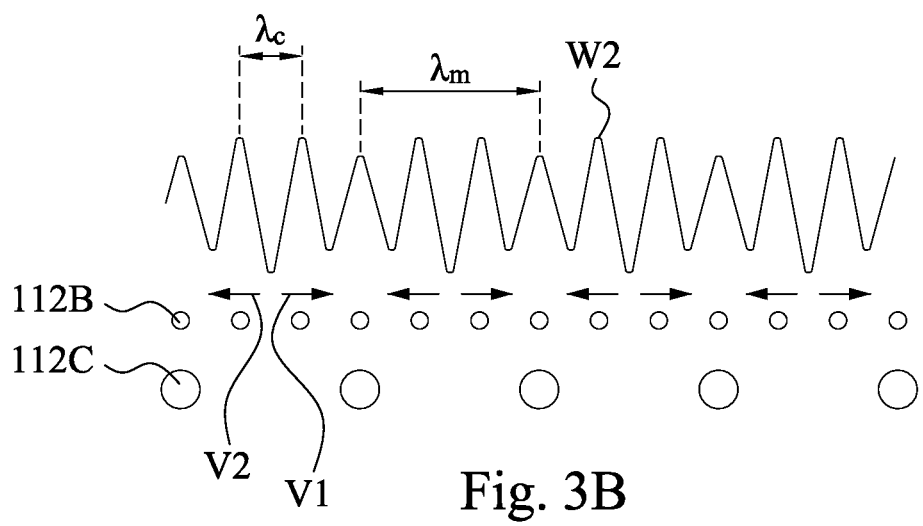
Figure 3C:
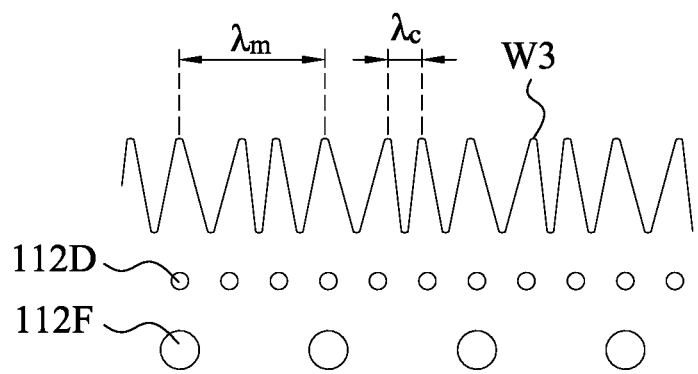

Reference is made to FIGS. 3A to 3C, shown there are different patterns of droplets in accordance with some embodiments of the present disclosure. FIGS. 3A to 3C are different, in that the electro-actuatable element 123 of FIG. 2 are operated to squeeze and/or un-squeeze the tube 125 with different frequencies, so as to modify the pattern of the ejected fuel droplets 112.

Reference is made to FIG. 3A, shown there is a pattern of fuel droplets 112A resulting from a single frequency, for example, a sine wave disturbance waveform W1. It can be seen that each period of the disturbance waveform W1 produces a droplet. FIG. 3A also illustrates that the fuel droplets 112A do not coalesce together, but rather, each droplet is established with the same initial velocity.

Reference is made to FIG. 3B, illustrates the pattern of fuel droplets 112B initially resulting from an amplitude modulated disturbance waveform W2. It can be seen that the amplitude modulated disturbance waveform W2 includes two characteristic frequencies, a relatively large frequency, e.g., carrier frequency, corresponding to wavelength $\lambda c$, and a smaller frequency, e.g., modulation frequency, corresponding to wavelength, $\lambda m$. For the disturbance waveform example shown in FIG. 3B, the modulation frequency is a carrier frequency subharmonic, and the modulation frequency is a third of the carrier frequency. With this waveform, FIG. 3B illustrates that each period of the disturbance waveform corresponding to the carrier wavelength $\lambda c$ produces a droplet. FIG. 3B also illustrates that the droplets coalesce together, resulting in a stream of larger fuel droplets 112C, with one larger droplet for each period of the disturbance waveform corresponding to the modulation wavelength $\lambda m$. Arrows V1 and V2 show the initial relative velocity components that are imparted on the droplets 112B by the modulated disturbance waveform W2, and are responsible for the droplet coalescence. In greater detail, the droplets 112B are initially ejected from the nozzle of the fuel droplet generator (e.g., the nozzle 124 of the fuel droplet generator 120 in FIG. 2). When the droplets 112B travel away from the fuel droplet generator, the droplets 112B begin to coalesce together and form the larger droplets 112C. For example, the initial droplets 112B may include a diameter in a range of about 6 µm, and the larger droplets 112C may include a diameter in a range of about 27 µm.

FIG. 3C illustrates the pattern of droplets 112D initially resulting from a frequency modulated disturbance waveform W3. It can be seen that the frequency modulated disturbance waveform W3 includes two characteristic frequencies, a relatively large frequency, e.g. carrier frequency, corresponding to wavelength $\lambda c$, and a smaller frequency, e.g. modulation frequency, corresponding to wavelength, $\lambda m$. For the disturbance waveform example shown in FIG. 3C, the modulation frequency is a carrier frequency subharmonic, and the modulation frequency is a third of the carrier frequency. With this waveform, FIG. 3C illustrates that each period of the disturbance waveform corresponding to the carrier wavelength $\lambda c$ produces a droplet 112б. FIG. 3C also illustrates that the droplets coalesce together, resulting in a stream of larger droplets 112F, with one larger droplet for each period of the disturbance waveform corresponding to the modulation wavelength km. Like the amplitude modulated disturbance (i.e., FIG. 3B), initial relative velocity components are imparted on the droplets by the frequency modulated disturbance waveform W3, and are responsible for the droplet coalescence.

FIGS. 3B and 3C show that the ejecting frequencies of the fuel droplets are tuned. Although FIGS. 3B and 3C show and discuss embodiments having two characteristic frequencies, with FIG. 3B illustrating an amplitude modulated disturbance having two characteristic frequencies, and FIG. 3C illustrating a frequency modulated disturbance having two frequencies, it is to be appreciated that more than two characteristic frequencies may be employed, and that the modulation may be either angular modulation (i.e., frequency or phase modulation), amplitude modulation, or combinations thereof.

Referring back to FIG. 2, the fuel droplet generator 120 further includes a plurality of oscillation sensors 300A, 300B, 300C, and 300D. In some embodiments, the oscillation sensors 300A and 300B are disposed at the nozzle 124 to detect the oscillation around the nozzle 124. On the other hand, the oscillation sensors 300C and 300D are disposed at the first portion 1201A of the reservoir 121 near the gas supply pipe 126 to detect the oscillation around the first portion 1201A of the reservoir 121. From another perspective, because the nozzle 124 is disposed inside the EUV source vessel 110, the oscillation sensors 300A and 300B are configured to detect the oscillation of the portion of the fuel droplet generator 120 inside the EUV source vessel 110. Similarly, because first portion 1201A of the reservoir 121 is disposed outside the EUV source vessel 110, the oscillation sensors 300C and 300D are configured to detect the oscillation of the portion of the fuel droplet generator 120 outside the EUV source vessel 110. In some embodiments, the oscillation sensors 300B is positioned close to the oscillation sensors 300A, and the oscillation sensors 300D is positioned close to the oscillation sensors 300C. In some embodiments, the oscillation sensors 300B can act as a back-up sensor of the oscillation sensor 300A, and vice versa. Similarly, the oscillation sensors 300D can act as a back-up sensor of the oscillation sensor 300C, and vice versa.

In some embodiments, the fuel F is filled into the reservoir 121 from the first portion 1201A of the reservoir 121, which is exposed at a non-vacuum environment. Therefore, some of the fuel F may react with oxygen because of the exposure to air. For example, when the fuel F includes tin (Sn), the tin fuel may react with oxygen in the air and produce solid tin oxide ($SnO_2$) in the reservoir 121. Although the fuel droplet generator 120 includes the filter 122 that is configured to filter the small particles in the reservoir 121, still some particles (e.g., the solid tin oxide particles) may still pass through the filter 122 and clog at the nozzle 124, which will result in unwanted oscillation at the nozzle 124 during operation. On the other hand, because the gas supply pipe 126 is arranged outside the EUV source vessel 110, the gas supply pipe 126 of the fuel droplet generator 120 may touch other devices in the system, such as wires. However, the oscillation of such devices may be transmitted to the fuel droplet generator 120 due to the connection thereof, and thus causes unwanted oscillation to the fuel droplet generator 120. These unwanted oscillations would affect the fuel droplet generator 120. For example, the fuel droplets 112 is ejected from the nozzle 124 along an ejecting trajectory (e.g., −X direction), but these unwanted oscillations may cause the fuel droplets 112 deviate from the ejecting trajectory. In FIG. 2, the fuel droplets 112 may deviate from the −X direction and shift along the Y-Z plane, such deviation will impact the quality of the fuel droplets 112. For example, the fuel droplets 112 may deviate from the trajectory of the laser beam 104 and cause a poor radiation quality, such as a reduced EUV intensity. On the other hand, the deviation of the fuel droplets 112 may also impact the coalescence of the fuel droplets 112, and thus the coalesced droplets (e.g, droplets 112C of FIG. 3B and droplets 112F of FIG. 3C) may have unstable size, which will also affect the EUV intensity. Here, the "unwanted oscillation" indicates an oscillation (e.g., a certain frequency) in the fuel droplet that results in an unsatisfied process performance.

In some embodiments of the present disclosure, the oscillation sensors 300A, 300B, 300C, and 300D are mounted on the fuel droplet generator 120 to address the above issues. The oscillation sensors 300A to 300D can sense the oscillation of the fuel droplet generator 120. If the sensed oscillation exceeds a predetermined threshold over the oscillation observed during normal or proper lithography operations, an abnormal condition is detected. Detection may, in an example embodiment, be done by visual inspection of a signal waveform displayed by the signal analyzer.

In some embodiments, the oscillation sensors 300A-300D may be available piezoelectric sensors for displacement, velocity, or acceleration. In alternative embodiments the oscillation sensors 300A-300D may be accelerometers such as are increasingly used in handheld devices to detect motion and acceleration, for example. MEMS accelerometers or other semiconductor accelerometers may be used. Piezoelectric sensors for oscillation are also commercially available and may be used with the embodiments.

Figure 4A:
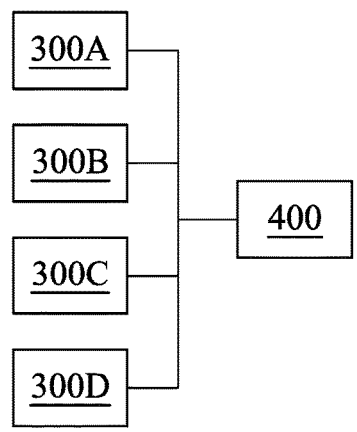
FIG. 4A is a block diagram in accordance with some embodiments of the present disclosure.
Figure 4B:
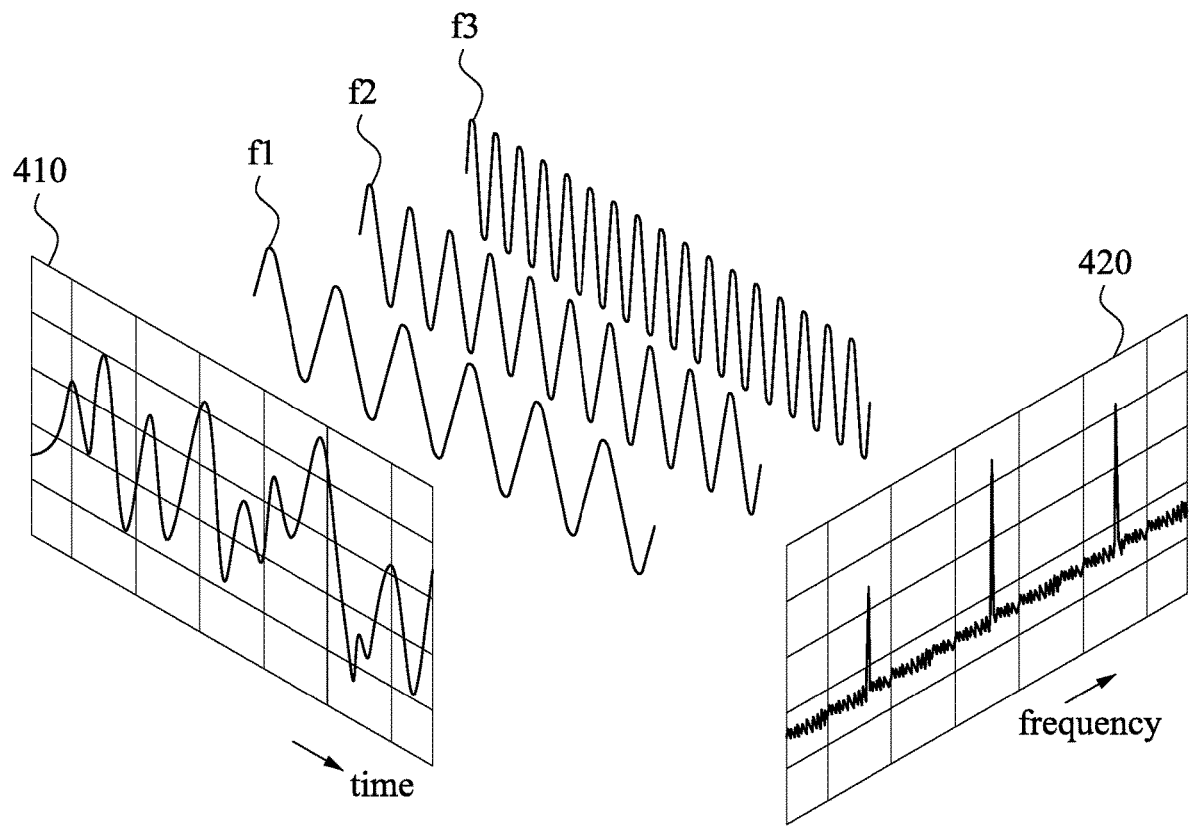
FIG. 4B is a schematic diagram of fast Fourier Transform in accordance with some embodiments of the present disclosure.

FIG. 4A is a block diagram in accordance with some embodiments of the present disclosure. FIG. 4B is a schematic diagram of fast Fourier Transform. In FIG. 4A, the oscillation sensors 300A-300D are electrically connected to a signal analyzer 400. The signal analyzer 400, in some embodiment, may include computer. The signal analyzer 400 can collect time domain signal information from oscillation sensors 300A-300D. In some embodiments, each of the oscillation sensors 300A-300D can detect a time-domain oscillation signal at its position. For example, in FIG. 4B, the signal analyzer 400 can collect a time-domain oscillation signal 410 from one of the oscillation sensors 300A-300D. Then, a fast Fourier transform (FFT) is employed to transfer the time-domain oscillation signal 410 into a frequency-domain oscillation signal 420 by the signal analyzer 400. As shown in FIG. 4B, the time-domain oscillation signal 410 is divided into several frequency component f1, f2, and f3 by FFT, in which these components are single sinusoidal oscillations at distinct frequencies, each with their own amplitude and phase. As a result shown in the frequency-domain oscillation signal 420, the signal information contains 3 distinct dominant frequencies. It is understood that FIG. 4B is merely used to explain, the present disclosure is not limited thereto.

An FFT algorithm computes the discrete Fourier transform (DFT) of a sequence. Fourier analysis converts a signal from its original domain to a representation in the frequency domain and vice versa. An FFT rapidly computes such transformations by factorizing the DFT matrix into a product of sparse (mostly zero) factors. As a result, it manages to reduce the complexity of computing the DFT from $O(n^2)$, which arises if one simply applies the definition of DFT, to $O(n\log n)$, where n is the data size.

Therefore, the signal analyzer 400 generates the frequency-domain oscillation signal 420, and the frequency-domain oscillation signal 420 can be used to detect if there is an unwanted oscillation exists in the fuel droplet generator 120 of FIG. 2. The detection may include comparing the real time received signal with the expected normal signal. In some embodiments, the comparison may simply entail visual inspection of the output frequency-domain oscillation signal information, visually comparing the output to a normal or expected signal output for the lithography system. In some other embodiments, the comparison may involve capturing a signal sample in the signal analyzer 400, as described above. The captured signal corresponding to the received signal is compared to an expected output signal for normal conditions. The expected output signal may be retrieved from stored signal templates. For example, these may be stored in a memory device, hard disk drive, EEPROM or flash, commodity memory or the like coupled to the signal analyzer 400 or even provided as part of the signal analyzer 400.

Referring back to FIG. 2, to conclude, the oscillation sensors 300A, 300B, 300C, and 300D can generate time-domain oscillation signals at the fuel droplet generator 120. Then, the signal analyzer 400 receive the time-domain oscillation signals from the oscillation sensors 300A, 300B, 300C, and 300D and transfer these signals into frequency-domain oscillation signals via FFT algorithm. Then, the output signals are compared with expected normal signals, so as to determine whether an unwanted oscillation exists in the fuel droplet generator 120. In greater detail, the oscillation sensors 300A and 300B are configured to detect the oscillation near the nozzle 124, and the oscillation sensors 300A and 300B are configured to detect the oscillation near the first portion 1201A of the reservoir 121. Stated another way, the oscillation sensors 300A and 300B are configured to detect the oscillation of the portion of fuel droplet generator 120 inside the EUV source vessel 110, and the oscillation sensors 300A and 300B are configured to detect the oscillation of the portion of fuel droplet generator 120 outside the EUV source vessel 110. As mentioned before, since the unwanted oscillations may be caused by the clogging of contamination at nozzle and external oscillation issue, by using the oscillation sensors 300A-300D that are disposed at different positions of the fuel droplet generator 120, it is possible to confirm where the unwanted oscillations actually are.

Figure 5:
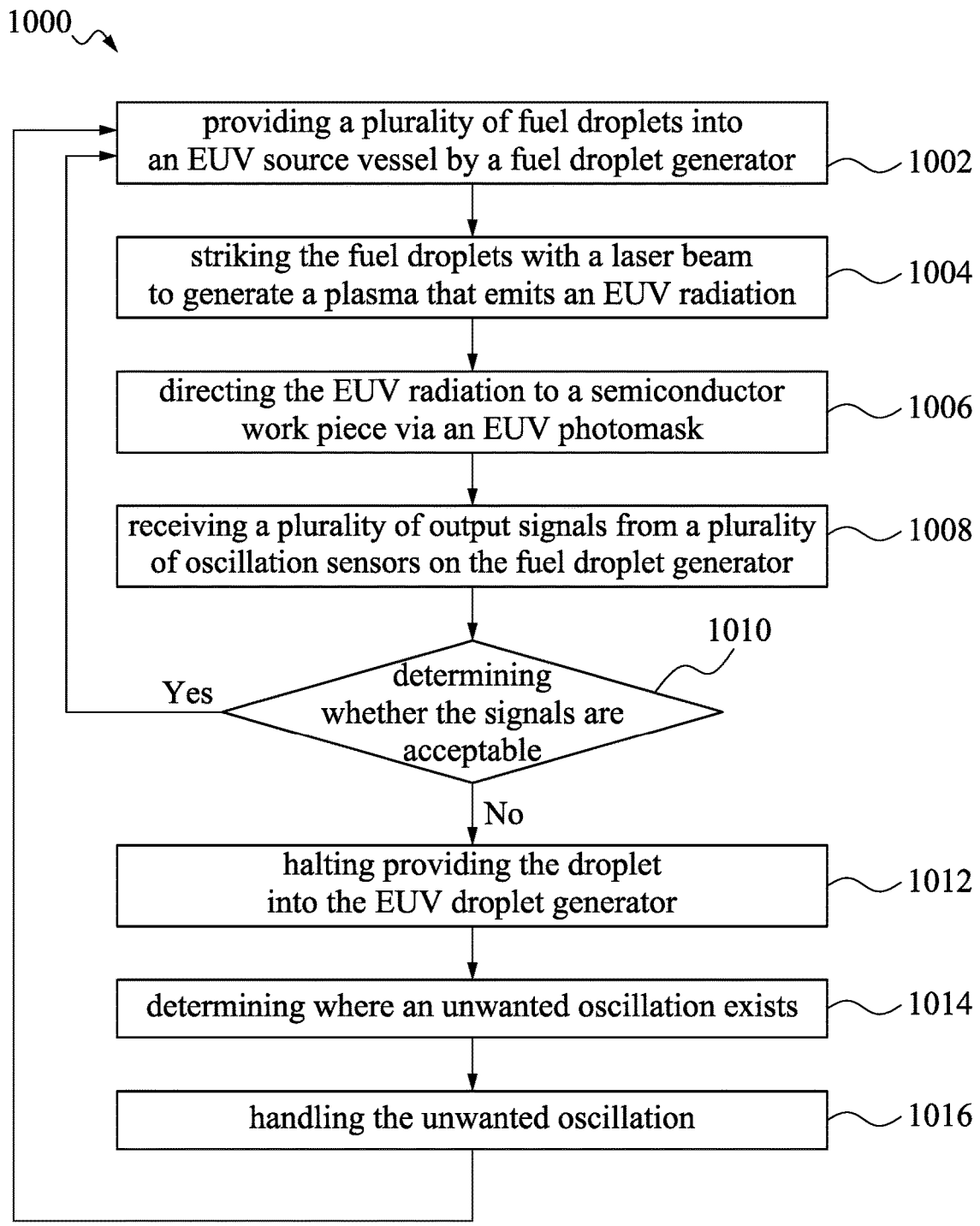
FIG. 5 is a method in accordance with some embodiments of the present disclosure.

FIG. 5 is a method in accordance with some embodiments of the present disclosure. The method 1000 begins at operation 1002 by providing a plurality of fuel droplets into an EUV source vessel by a fuel droplet generator. As shown in FIGS. 1 and 2, in the beginning, a fuel F are filled in the reservoir 121 of the fuel droplet generator 120. Then, a gas is introduced into the reservoir 121 through the gas supply pipe 126, so as to force the fuel F flow into the tube 125 from the bottom of the reservoir 121 and pass through tube 125 until the fuel F is ejected from the nozzle 124. When the fuel F flows to the nozzle 124, the fuel F subsequently breaks-up into fuel droplets 112.

The method 1000 proceeds to operation 1004 by striking the fuel droplets with a laser beam to generate a plasma that emits an EUV radiation. As shown in FIG. 1, the laser source 102 produces a laser beam 104. Then, the laser beam 104 passes through the beam transport system 106 and the focusing system 108, and then the laser beam 104 is output from the focusing system 108 to the EUV source vessel 110. When the laser beam 104 strikes the fuel droplets 112, the fuel droplets 112 shed their electrons and become a plasma 114 including a plurality of ions, thereby generating the EUV radiation 116.

The method 1000 proceeds to operation 1006 where directing the EUV radiation to a semiconductor work piece via an EUV photomask. As shown in FIG. 1, the collector mirror 118 focuses the EUV radiation 116 generated by the plasma 114 toward the scanner 200 via the intermediate focus (IF) unit 130 within an exit aperture of the EUV source vessel 110. The scanner 200 includes optical elements configured to direct the EUV radiation 116 to the semiconductor workpiece 250. The EUV radiation 116 output from the EUV source vessel 110 is provided to a condenser 210 of the scanner 200, which is configured to focus the EUV radiation 116 towards the EUV photomask 220. The EUV photomask 220 is configured to reflect the EUV radiation 116 to form a pattern on a surface of a semiconductor workpiece 250. In some embodiments, operations 1002-1006 can be collectively referred to as a lithography process.

The method 1000 proceeds to operation 1008 by receiving a plurality of output signals from a plurality of oscillation sensors on the fuel droplet generator. As shown in FIG. 2, the oscillation sensors 300A-300D on the fuel droplet generator 120 can detect the oscillation of the fuel droplet generator 120. In some embodiments, the oscillation sensors 300A-300D can generate time-domain oscillation signals. Then, the time-domain oscillation signals are transferred, by fast Fourier transform algorithm, to frequency-domain oscillation signals via a signal analyzer, as described in FIGS. 4A and 4B. Here, the "output signal" can also be referred to as the "frequency-domain oscillation signals."

The method 1000 proceeds to operation 1010 by determining whether the signals are acceptable. For example, the output signals are compared with expected normal signals, so as to determine whether an unwanted oscillation exists in the fuel droplet generator. In some embodiments, the user can determine whether the difference between the received output signals and the expected normal signal exceeds a predetermined threshold. For example, the received output signal of one of the oscillation sensors 300A-300D of FIG. 2 is compared with the expected normal signal of the corresponding one of the oscillation sensors 300A-300D. If the received output signal has a certain frequency that is abnormal, i.e., a certain frequency of the output signal has a relatively high magnitude that is not present in the expected normal signal, such abnormal frequency indicates an unwanted oscillation exists in the fuel droplet generator.

It is noted that, in the following discussion, the "acceptable" condition indicates all of the output signals are acceptable. On the other hand, the "unacceptable" condition indicates at least one of the output signals of oscillation sensors 300A-300D of FIG. 2 is unacceptable. Here, the "normal signals" indicate the "frequency-domain oscillation signals" detected under a normal condition. In some embodiments, the "normal condition" used herein can indicate a condition where a result of patterning a semiconductor workpiece (e.g., the semiconductor workpiece 250 in FIG. 1) is acceptable. In some other embodiments, the "normal condition" can indicate where an image captured from the droplet imager (e.g., the droplet imager 140 in FIG. 1) is acceptable. In yet some other embodiments, the "normal condition" can indicate where a EUV intensity (or energy) detected from an EUV energy monitor (e.g., the EUV energy monitor 150) is acceptable.

If the output signals are acceptable (e.g., the difference between the received output signals and the expected normal signals does not exceed the predetermined threshold), the method 1000 then returns back to the operation 1002 and continues proceeding the operations 1002-1006. That is, the lithography process (e.g., operations 1002-1006) is continuously performed.

However, if the output signals are unacceptable (e.g., the difference between the received output signals and the expected normal signals exceed the predetermined threshold), the method 1000 proceeds to operation 1012 by halting providing the droplet into the EUV droplet generator. That is, as shown in FIGS. 1 and 2, the fuel droplet generator 120 is stopped providing fuel droplets 112 into the EUV source vessel 110. In some embodiments, stopping or halting the fuel droplet generator 120 includes stopping introducing gas into the reservoir 121 of the fuel droplet generator 120 from the gas supply pipe 126.

The method 1000 proceeds to operation 1014 by determining where an unwanted oscillation exists. Referring to FIG. 2, if the abnormal output signals are originated from the oscillation sensors 300A and 300B, it indicates that the unwanted oscillation exists at the portion of the fuel droplet generator 120 inside the EUV source vessel 110, such as the nozzle 124. For example, such unwanted oscillation may be originated from the clogging at the nozzle 124. One the other hand, if the abnormal output signals are originated from the oscillation sensors 300C and 300D, it indicates that the unwanted oscillation exists at the portion of the fuel droplet generator 120 outside the EUV source vessel 110, such as by an external oscillation issue. In some embodiments, such external oscillation issue indicates other system device, such as wire, touches the gas supply pipe 126 of the fuel droplet generator 120 and transmits the unwanted oscillation to the fuel droplet generator 120.

The method 1000 proceeds to operation 1016 by handling the unwanted oscillation. Referring to FIG. 2, if the unwanted oscillation exists at the portion of the fuel droplet generator 120 inside the EUV source vessel 110, such as the nozzle 124, a cleaning process may be performed to remove the clogging at the nozzle 124 in some embodiments. In some other embodiments, the nozzle 124 may be swapped for a new one. On the other hand, if the unwanted oscillation exists at the portion of the fuel droplet generator 120 inside the EUV source vessel 110, the unwanted oscillation may be handled by, for example, moving away the external device, such as wire, that causes the unwanted oscillation to the fuel droplet generator 120 from the fuel droplet generator 120.

After the unwanted oscillation is handled, the operations 1002 to 1006 may be performed accordingly. That is, the lithography process (e.g., operations 1002-1006) is continuously performed.

Figure 6:
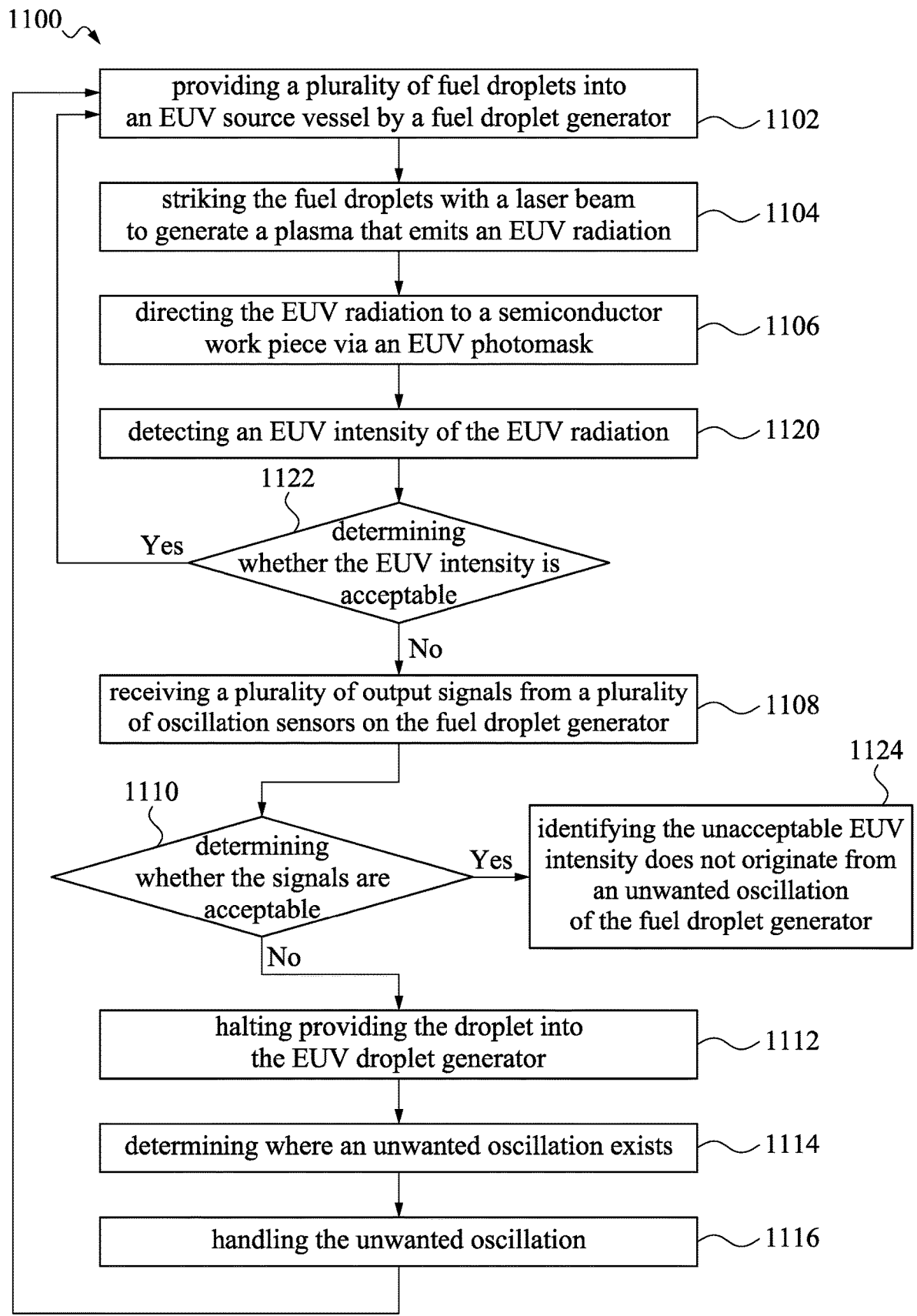
FIG. 6 is a method in accordance with some embodiments of the present disclosure.

FIG. 6 is a method in accordance with some embodiments of the present disclosure. Method 1100 begins at operation 1102 by providing a plurality of fuel droplets into an EUV source vessel by a fuel droplet generator. Then, method 1100 proceeds to operation 1104 by striking the fuel droplets with a laser beam to generate a plasma that emits an EUV radiation. Method 1100 proceeds to operation 1106 where directing the EUV radiation to a semiconductor work piece via an EUV photomask. Operations 1102-1106 are similar to operations 1002-1006 described in FIG. 5, and thus relevant details will not be repeated for simplicity.

Method 1100 proceeds to operations 1120 by detecting an EUV intensity of the EUV radiation. Reference is made to FIG. 1. After the EUV radiation 116 is generated, the EUV energy monitor 150 starts to monitor the EUV intensity of the EUV radiation 116.

Method 1100 proceeds to operations 1122 by determining whether the EUV intensity is acceptable. In some embodiments, the determination is performed by determining whether the EUV intensity of the EUV radiation 116 is below a threshold value. If the EUV intensity of the EUV radiation 116 is below a threshold value, the detected EUV intensity is determined as unacceptable. In some embodiments, if the EUV intensity is too low, the energy of the EUV radiation 116 of FIG. 1 is not sufficient enough to result in a desired lithography performance. In some embodiments, such situation can be referred to as a dose error. In contrast, if the EUV intensity of the EUV radiation 116 is over the threshold value, the detected EUV intensity is determined as acceptable, because the energy of the EUV radiation 116 is sufficient to maintain the lithography performance.

If the EUV intensity is acceptable, the method 1100 then returns back to the operation 1102 and continues proceeding the operations 1102-1106. That is, the lithography process (e.g., operations 1102-1106) is continuously performed.

However, if the EUV intensity is unacceptable, the method 1100 proceeds to operation 1108 by receiving a plurality of output signals from a plurality of oscillation sensors on the fuel droplet generator. Reference is made to FIGS. 1 and 2. As mentioned before, an unwanted oscillation in the fuel droplet generator 120 may result in unstable ejected fuel droplets, such as the fuel droplets may deviate from their ejecting trajectory. The laser beam 104 may strike the deviated fuel droplets and thus reduce the intensity of plasma 114. Therefore, the EUV intensity is reduced accordingly. As a result, if the EUV intensity is unacceptable, the oscillation in the fuel droplet generator may be detected to determine whether an unwanted oscillation exists in the fuel droplet generator. Operation 1108 is similar to operation 1008 described in FIG. 5, and thus relevant details will not be repeated for simplicity.

The method 1100 proceeds to operation 1110 by determining whether the signals are acceptable. Operation 1110 is similar to operation 1010 described in FIG. 5, and thus relevant details will not be repeated for simplicity.

If the output signals are acceptable, the method 1100 proceeds to operation 1124 by identifying the unacceptable EUV intensity does not originate from an unwanted oscillation of the fuel droplet generator. In some embodiments, other approaches may be performed to deal with the unacceptable EUV intensity.

However, if the output signals are unacceptable, the method 1100 proceeds to operation 1112 by halting providing the droplet into the EUV droplet generator. In some embodiments, if the output signals are unacceptable, it indicates that the unacceptable EUV intensity may originate an unwanted oscillation of the fuel droplet generator. Thus, the method 1100 proceeds to operation 1114 by determining where an unwanted oscillation exists. Then, the method 1100 proceeds to operation 1116 by handling the unwanted oscillation. Operations 1112-1116 are similar to operations 1012-1016 described in FIG. 5, and thus relevant details will not be repeated for simplicity.

After the unwanted oscillation is handled, the operations 1102 to 1106 may be performed accordingly. That is, the lithography process (e.g., operations 1102-1106) is continuously performed.

Figure 7:
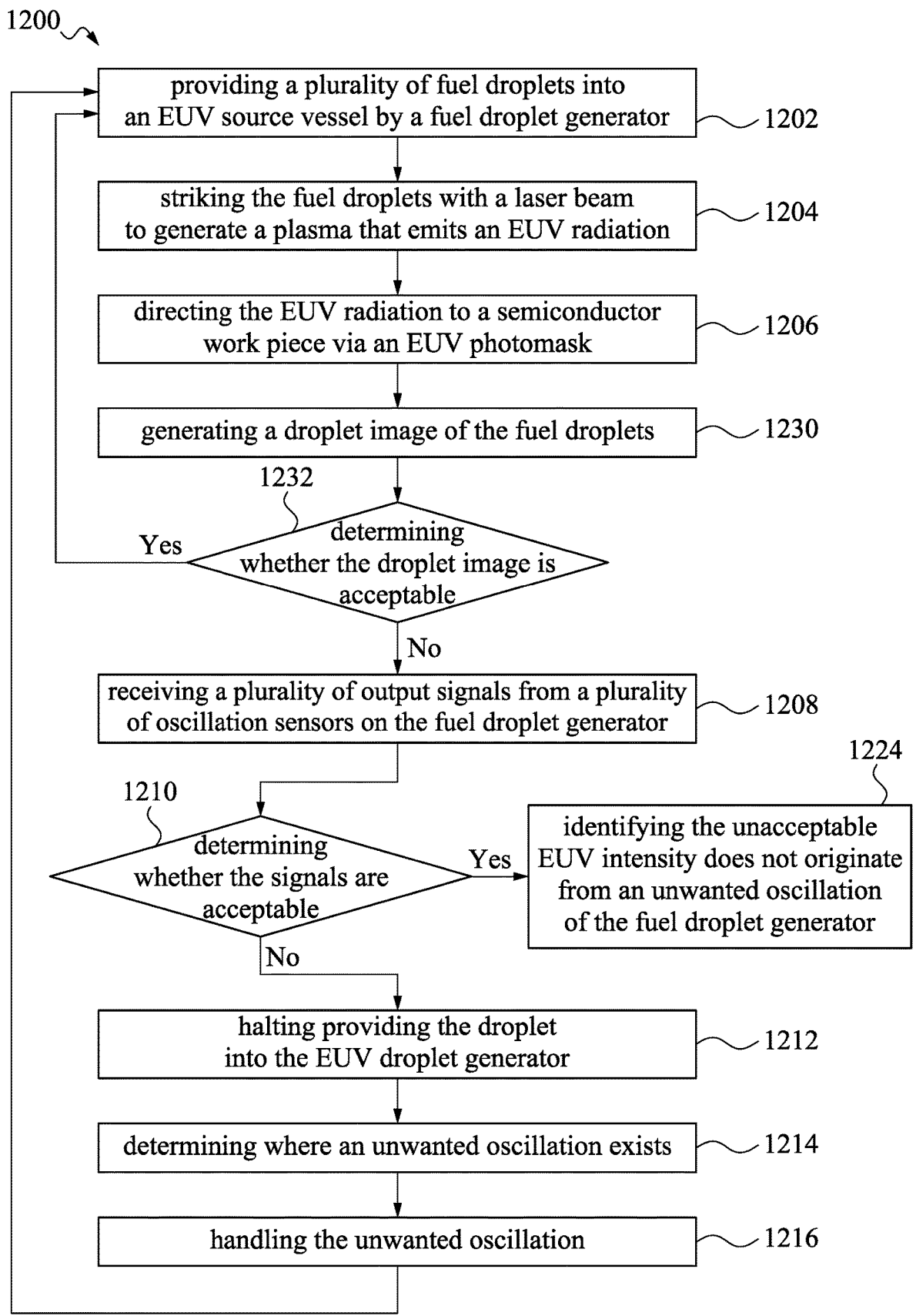
FIG. 7 is a method in accordance with some embodiments of the present disclosure.

FIG. 7 is a method in accordance with some embodiments of the present disclosure. Method 1200 begins at operation 1202 by providing a plurality of fuel droplets into an EUV source vessel by a fuel droplet generator. Then, method 1200 proceeds to operation 1204 by striking the fuel droplets with a laser beam to generate a plasma that emits an EUV radiation. Method 1200 proceeds to operation 1206 where directing the EUV radiation to a semiconductor work piece via an EUV photomask. Operations 1202-1206 are similar to operations 1002-1006 described in FIG. 5, and thus relevant details will not be repeated for simplicity.

Method 1200 proceeds to operations 1230 by generating a droplet image of the fuel droplets. Reference is made to FIG. 1. After the fuel droplets 112 are ejected from the fuel droplet generator 120, the droplet imager 140 starts to captures an image of the fuel droplets 112.

Method 1100 proceeds to operations 1232 by determining whether the droplet image is acceptable. In some embodiments, the determination is performed by determining whether the fuel droplets shown in the image deviate from an ejecting trajectory. Reference is made to FIGS. 1 and 2. After, the fuel droplets 112 are ejected from the fuel droplet generators 120, the fuel droplets 112 are supposed to travel along an ejecting trajectory (i.g., −X direction in FIG. 2). If the captured image shows that the fuel droplets 112 are at a desired position, the droplet image is determined as acceptable. However, if the captured image shows that, for example, at least one of the fuel droplets 112 deviates from the ejecting trajectory beyond a threshold value, the droplet image is determined as unacceptable.

If the droplet image is acceptable, the method 1200 then returns back to the operation 1202 and continues proceeding the operations 1202-1206. That is, the lithography process (e.g., operations 1202-1206) is continuously performed.

However, if the droplet image is unacceptable, the method 1200 proceeds to operation 1208 by receiving a plurality of output signals from a plurality of oscillation sensors on the fuel droplet generator. Reference is made to FIGS. 1 and 2. As mentioned before, an unwanted oscillation in the fuel droplet generator 120 may result in unstable ejected fuel droplets, such as the fuel droplets may deviate from their ejecting trajectory. As a result, if the droplet image is unacceptable, the oscillation in the fuel droplet generator may be detected to determine whether an unwanted oscillation exists in the fuel droplet generator. Operation 1208 is similar to operation 1008 described in FIG. 5, and thus relevant details will not be repeated for simplicity.

The method 1200 proceeds to operation 1210 by determining whether the signals are acceptable. Operation 1210 is similar to operation 1010 described in FIG. 5, and thus relevant details will not be repeated for simplicity.

If the output signals are acceptable, the method 1200 proceeds to operation 1224 by identifying the unacceptable droplet image does not originate from an unwanted oscillation of the fuel droplet generator. In some embodiments, other approaches may be performed to deal with the unacceptable droplet image.

However, if the output signals are unacceptable, the method 1200 proceeds to operation 1212 by halting providing the droplet into the EUV droplet generator. In some embodiments, if the output signals are unacceptable, it indicates that the unacceptable EUV intensity may originate an unwanted oscillation of the fuel droplet generator. Thus, the method 1200 proceeds to operation 1214 by determining where an unwanted oscillation exists. Then, the method 1200 proceeds to operation 1216 by handling the unwanted oscillation. Operations 1212-1216 are similar to operations 1212-1216 described in FIG. 5, and thus relevant details will not be repeated for simplicity.

After the unwanted oscillation is handled, the operations 1202 to 1206 may be performed accordingly. That is, the lithography process (e.g., operations 1202-1206) is continuously performed.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that a plurality of oscillation sensors are disposed on a fuel droplet generator, so as to real-time detect the oscillations of different portions of the fuel droplet generator. Another advantage is that by using oscillation sensors at different positions of the fuel droplet generator, it is possible to confirm whether an unwanted oscillation in the fuel droplet generator is originated from the fuel droplet generator itself or external oscillation. Yet advantage is that since an abnormal condition in the fuel droplet generator can be detected by the oscillation sensors, the available time of the fuel droplet generator can be extended by handling such abnormal condition in a short time.

In some embodiments of the present disclosure, a method includes providing a plurality of fuel droplets into an EUV source vessel by a fuel droplet generator, in which the fuel droplet generator has a first portion inside the EUV source vessel and a second portion outside the EUV source vessel; generating a plurality of output signals respectively from a plurality of oscillation sensors on the fuel droplet generator; determining whether the output signals are acceptable; and determining whether an unwanted oscillation originates from the first portion of the fuel droplet generator or the second portion of the fuel droplet generator when the output signals is determined as unacceptable.

In some embodiments of the present disclosure, a method includes providing a plurality of fuel droplets into an EUV source vessel by a fuel droplet generator, in which the fuel droplet generator has a first portion exposed to a first environment and a second portion exposed to a second environment having a lower atmosphere pressure than the first environment; striking the fuel droplets with a laser beam to generate a plasma that emits an EUV radiation; detecting a first oscillation of the first portion of the fuel droplet generator and a second oscillation of the second portion of the fuel droplet generator; determining whether the first oscillation and the second oscillation are acceptable; and halting providing the fuel droplets when the first oscillation or the second oscillation is unacceptable.

In some embodiments of the present disclosure, a system includes an EUV source vessel, a fuel droplet generator, a laser source, and a first oscillation sensor. The fuel droplet generator is connected to the EUV source vessel, in which the fuel droplet generator includes a first portion inside the EUV source vessel and a second portion outside the EUV source vessel. The laser source is connected to the EUV source vessel. The first oscillation sensor is disposed on the first portion of the fuel droplet generator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a plurality of fuel droplets into an EUV source vessel by a fuel droplet generator, wherein the fuel droplet generator has a first portion inside the EUV source vessel and a second portion outside the EUV source vessel;
generating a plurality of output signals respectively from a plurality of oscillation sensors on the fuel droplet generator;
determining whether the output signals are acceptable; and determining whether an unwanted oscillation originates from the first portion of the fuel droplet generator or the second portion of the fuel droplet generator when the output signals is determined as unacceptable.

2. The method of claim 1, further comprising performing a cleaning process to a nozzle of the fuel droplet generator when the unwanted oscillation exists at the first portion of the fuel droplet generator.

3. The method of claim 1, further comprising swapping a nozzle of the fuel droplet generator for a new nozzle when the unwanted oscillation exists at the first portion of the fuel droplet generator.

4. The method of claim 1, further comprising moving away an external device that touches the fuel droplet generator.

5. The method of claim 1, wherein receiving a plurality of output signals comprising:
   receiving a plurality of time-domain oscillation signals respectively from the oscillation sensors; and
   transferring the time-domain oscillation signals respectively to a plurality of frequency-domain oscillation signals via a fast Fourier transform (FFT) algorithm.

6. The method of claim 1, wherein determining whether the output signals are acceptable comprises comparing the output signals respectively with a plurality of expected normal signals.

7. The method of claim 1, further comprising tuning an ejecting frequency of the fuel droplets.

8. The method of claim 1, further comprising halting providing the fuel droplets into an EUV source vessel when the output signals is determined as unacceptable.

9. A method, comprising:
   providing a plurality of fuel droplets into an EUV source vessel by a fuel droplet generator, wherein the fuel droplet generator has a first portion exposed to a first environment and a second portion exposed to a second environment having a lower atmosphere pressure than the first environment;
   striking the fuel droplets with a laser beam to generate a plasma that emits an EUV radiation;
   detecting a first oscillation of the first portion of the fuel droplet generator and a second oscillation of the second portion of the fuel droplet generator;
   determining whether the first oscillation and the second oscillation are acceptable; and
   halting providing the fuel droplets when the first oscillation or the second oscillation is unacceptable.

10. The method of claim 9, wherein detecting the first oscillation comprises:
    receiving a time-domain oscillation signal from a first oscillation sensor disposed on a nozzle of the fuel droplet generator; and
    transferring the time-domain oscillation signal to a frequency-domain oscillation signal via a fast Fourier transform (FFT) algorithm.

11. The method of claim 9, wherein detecting the second oscillation comprises:
    receiving a time-domain oscillation signal from a second oscillation sensor disposed on a reservoir of the fuel droplet generator; and
    transferring the time-domain oscillation signal to a frequency-domain oscillation signal via a fast Fourier transform (FFT) algorithm.

12. The method of claim 9, further comprising:
    detecting an EUV intensity of the EUV radiation; and
    determining whether the EUV intensity is acceptable, wherein determining whether the first oscillation and the second oscillation are acceptable is performed when the EUV intensity is determined as unacceptable.

13. The method of claim 12, wherein determining whether the EUV intensity is acceptable comprises determining whether the detected EUV intensity is below a threshold value.

14. The method of claim 9, further comprising:
    capturing an image of the fuel droplets; and
    determining whether the image is acceptable, wherein determining whether the first oscillation and the second oscillation are acceptable is performed when the image is determined as unacceptable.

15. The method of claim 14, wherein determining whether the image is acceptable comprises determining whether the fuel droplets deviate from an ejecting trajectory.

16. The method of claim 9, wherein detecting the first oscillation is performed by receiving an oscillation signal from an oscillation sensor disposed on the first portion of the fuel droplet generator.

17. A system, comprising:
    an EUV source vessel;
    a fuel droplet generator connected to the EUV source vessel, wherein the fuel droplet generator comprises a first portion inside the EUV source vessel and a second portion outside the EUV source vessel;
    a laser source connected to the EUV source vessel; and
    a first oscillation sensor disposed on the first portion of the fuel droplet generator.

18. The system of claim 17, wherein the first portion of the fuel droplet generator comprises a nozzle, wherein the first oscillation sensor is disposed on the nozzle.

19. The system of claim 17, further comprising a second oscillation sensor disposed on the second portion of the fuel droplet generator.

20. The system of claim 19, further comprising:
    a third oscillation sensor disposed on the first portion of the fuel droplet generator; and
    a fourth oscillation sensor disposed on the second portion of the fuel droplet generator.

* * * * *